United States Patent
Hsu

(10) Patent No.: US 9,269,814 B2
(45) Date of Patent: Feb. 23, 2016

(54) SACRIFICIAL LAYER FIN ISOLATION FOR FIN HEIGHT AND LEAKAGE CONTROL OF BULK FINFETS

(71) Applicant: Taiwan Semiconductor Manufacturing Co., Ltd., Hsin-Chu (TW)

(72) Inventor: Yu-Rung Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/277,310

(22) Filed: May 14, 2014

(65) Prior Publication Data

US 2015/0333171 A1 Nov. 19, 2015

(51) Int. Cl.
*H01L 27/12* (2006.01)
*H01L 29/78* (2006.01)
*H01L 29/66* (2006.01)
*H01L 21/764* (2006.01)

(52) U.S. Cl.
CPC ............ *H01L 29/785* (2013.01); *H01L 21/764* (2013.01); *H01L 29/66795* (2013.01)

(58) Field of Classification Search
CPC ...................... H01L 21/823431; H01L 21/762; H01L 21/76224; H01L 21/764; H01L 21/02488; H01L 21/76264; H01L 29/49; H01L 29/0653; H01L 29/16; H01L 29/0649; H01L 29/785

USPC .......................................... 257/347; 438/479
See application file for complete search history.

(56) References Cited

U.S. PATENT DOCUMENTS

| 2005/0233565 A1* | 10/2005 | Zhu et al. ...................... 438/602 |
| 2013/0221491 A1 | 8/2013 | Wann et al. |
| 2015/0041898 A1* | 2/2015 | Loubet et al. ................. 257/347 |

OTHER PUBLICATIONS

Huajie, et al. "Fabrication of Bulk-Si FinFET Using CMOS Compatible Process." Microelectronic Engineering 94 (2012) 26-28. Published in 2012.

* cited by examiner

*Primary Examiner* — Trung Q Dang
(74) *Attorney, Agent, or Firm* — Eschweiler & Associates, LLC

(57) ABSTRACT

The present disclosure relates to a structure and method for fin isolation in bulk FinFETs. A sacrificial portion is formed between the actual fin and the substrate, which gets selectively removed at a later stage of processing to reveal a cavity which extends all the way under the fin. This helps prevent source/drain leakage as there is no path for current flow between the fin and bulk substrate. Furthermore, this method of formation helps in precise control of fin-height in bulk FinFETs.

20 Claims, 7 Drawing Sheets

SACRIFICIAL LAYER FIN ISOLATION FOR FIN HEIGHT AND LEAKAGE CONTROL OF BULK FINFETS

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators can continue to overcome the technological challenges associated with it. In particular, one trend to increase transistor density in recent years is to go to three dimensional gates—so called "FinFETs"—which tend to improve performance compared to conventional planar device at equal power supply voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
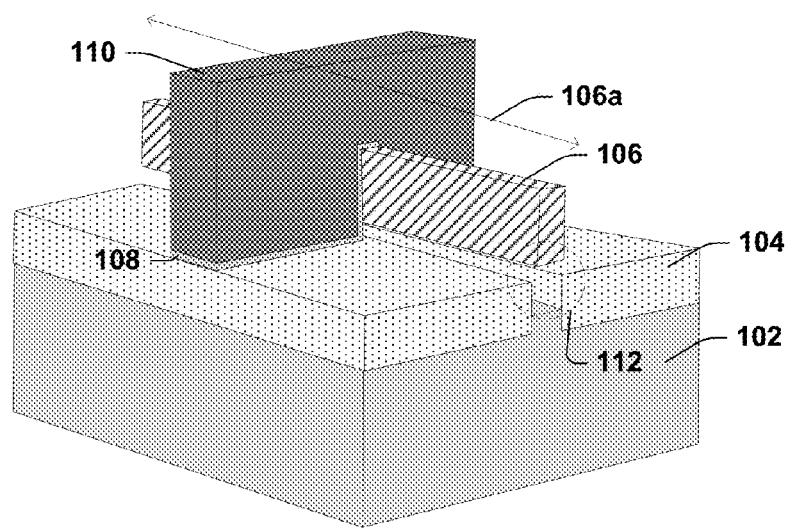
FIG. 1A illustrates a perspective view of a FinFET that includes a cavity which separates a lower surface of a suspended fin from a region of a semiconductor substrate aligned under the fin, according to the present disclosure.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FinFETs have been considered to be one of the most promising device structures to replace conventional planar MOSFETs in the near future, because FinFETs have good scalability, robustness, SCE (short channel effect) immunity and ideal sub-threshold swing. Most of the reported FinFETs are classified into two types: SOI (silicon on insulator) and bulk Si (silicon) FinFETs. Due to the existence of buried oxide, SOI FinFETs have many advantages, such as easier realization, lower leakage current and higher speed. Compared with SOI FinFETs, bulk Si FinFETs possess advantages of low cost, low defect density, little or no floating-body effect, good heat dissipation, etc. However, bulk-Si FinFETs suffer large leakage current. Since the bottom of the fin is un-gated or unseparated from the bulk, source-drain punch through can occur, which causes large leakage current. In order to suppress the leakage current, the common isolation approach of bulk-Si FinFETs involve introducing punch-through stopping (PTS) at the bottom of the fin. However, the introduction of PTS is a more challenging work because it can induce many critical issues, such as large drain junction tunneling current, large junction leakage current and capacitance, and complicated fabrication process. The thermal oxidation process involved in the PTS method consumes the fin vertically and horizontally leading to major profile control issues. Moreover, the possibility of up-diffusion of the underlying PTS doping into fin channels is another serious problem that increases threshold voltage (Vth) and decreases on-current (Ion).

Different FinFETs having different fin pitches are used in different areas of a semiconductor apparatus. The differences in fin pitch result in different areas having different fin densities. During fin formation, a localized etch loading effect causes areas having different fin densities to have different fin heights. (Loading effect occurs as a result of gas phase etchant being depleted by loading effect occurs as a result of gas phase etchant being depleted by reaction with the substrate material). Process-induced fin height variations affect the electrical properties of the FinFETs. Fin height variations can occur during different stages of fabrication in bulk Si FinFETs. Some of them include: fin-height variation from etch loading effect, fin-height variation from wet processes such as cleaning, pad oxide removal etc. and fin-height variation from gate etching and post cleaning. While process tuning can improve the fin height uniformity, better fin height control in bulk FinFETs continues to be sought.

Accordingly, the present disclosure relates to a new structure and processing technique for FinFETs that involve formation of a sacrificial portion between a body fin and a bulk substrate aligned under the body fin. After formation of the gate electrode of the FinFET, the sacrificial portion is selectively removed, to create a cavity or isolation region between the body fin and the bulk substrate under the body fin. This cavity provides comparable isolation performance when compared to SOI FinFETs, but with a lower processing cost. The method prevents source/drain leakage as there is no path for current flow between the fin and bulk substrate. Furthermore, this method of formation helps in precise control of fin-height in bulk FinFETs since the sacrificial layer between the body fin layer and the bulk substrate prevents etch loading effect. It also helps control intra-fin STI oxide profile control issues (controlling height differences of STI oxide between two fins).

FIG. 1A illustrates a perspective view of a FinFET device 100a that includes a cavity which separates a lower surface of a suspended fin from a region of a semiconductor substrate aligned under the fin, according to the present disclosure. The FinFET device 100a resides on a semiconductor substrate 102. In some embodiments, the semiconductor substrate comprises silicon (Si). An isolation material 104 resides on defined regions above the substrate 102, specifically on either side of a fin region. A semiconductor body fin 106 is suspended from a conductive gate electrode 110 over the semiconductor substrate 102. In some embodiments, the semiconductor body fin 106 comprises Si. A gate dielectric 108 resides under the bottom surface of the gate electrode 110. The gate electrode 110 and the gate dielectric 108 are disposed perpendicularly across a fin direction 106a. The gate dielectric 108 abuts top surface of the body fin 106 as well as top surfaces of the isolation region 104 on either side of the body fin 106 along a direction perpendicular to the fin direction 106a. In some embodiments, the gate dielectric 108 comprises an oxide and the gate electrode 110 comprises poly silicon. A cavity 112 runs along the fin direction 106a creating air gap isolation between the body fin 106 and the substrate 102 under the body fin 106.

Figure 1B:
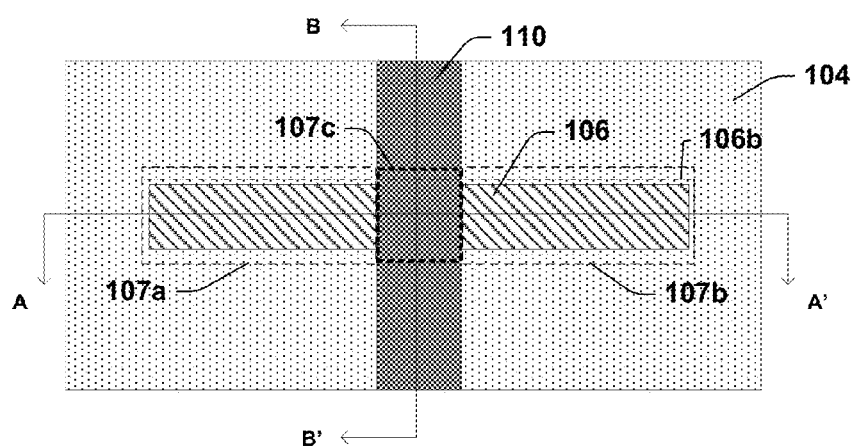
FIGS. 1B-1D illustrates various views, including cross sectional views of the FinFET in FIG. 1A.
Figure 1C:
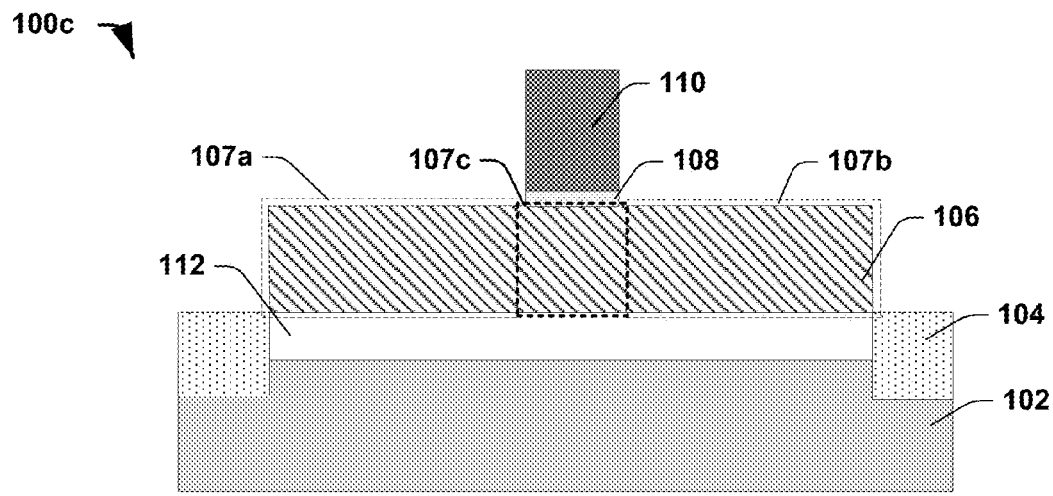
Figure 1D:
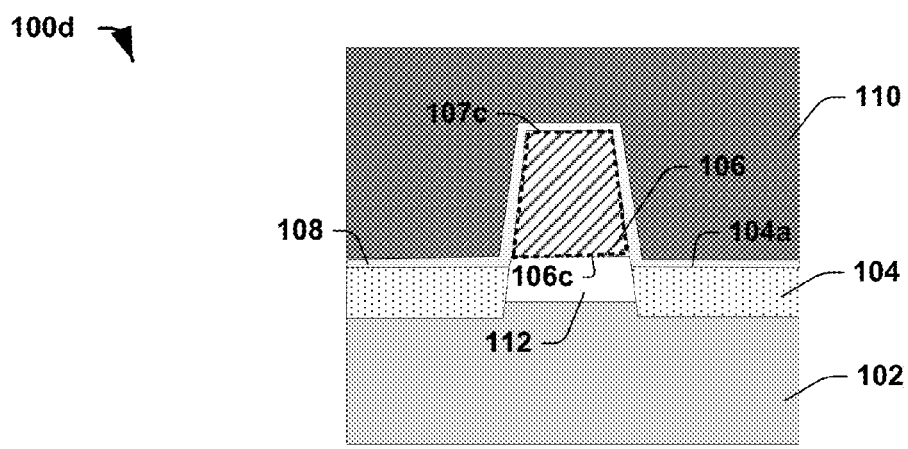

FIGS. 1B-1D illustrate various views, including cross sectional views of the FinFET device in FIG. 1A.

FIG. 1B illustrates a top view 100b of the FinFET device 100. Source/drain (S/D) regions 107a, 107b are arranged in the body fin 106 on opposite edges of the gate electrode 110. The source/drain regions 107a, 107b have a first doping type (e.g., n-type), while a channel region 107c has a second, opposite doping type (e.g., p-type) or no doping. In some embodiments, the channel region 107c is a dummy polysilicon gate (DPG), which will be removed and replaced with other materials like TiN/W etc (replacement gate technology-RPG). During operation, a gate voltage is applied to the gate electrode 110, which can cause charge carriers to accumulate in the channel region 107c or can cause inversion in the channel region 107c, depending on the magnitude of the applied gate voltage. While the gate voltage is applied, a voltage between the source/drain regions 107a, 107b can be concurrently applied, which will sweep charge carriers between source/drain regions 107a, 107b and thereby cause current to flow (i.e., the FinFET is "on"). If a magnitude of the gate voltage is less than a threshold voltage of the FinFET, very little or no current flows between source/drain regions 107a, 107b (i.e., the FinFET is "off"). The suspended body fin 106 has an outer perimeter 106b, as viewed from above, that is substantially aligned to an outer perimeter of the cavity. In some embodiments, the source/drain regions 107a and 107b are removed by etching and an epitaxially grown layer of SiGe (silicon germanium) or SiP (silicon phosphate) will act as the source and drain regions.

FIG. 1C illustrates a cross sectional view of a semiconductor device 100c, where the cross section is taken along AA' of 100a. The cavity 112 extends continuously under the channel region 107c the source/drain regions 107a and 107b extends on either side of the channel region 107c along the fin.

FIG. 1D illustrates a cross sectional view of a semiconductor device 100d, where the cross section is taken along BB' of 100a. The cavity 112 clearly separates a lower surface 106c of the body fin 106 from the substrate 102 which makes sure there is no path for leakage of current during FinFET operation. Also, the lower surface 106c of the suspended body fin 106 is arranged above an adjacent upper surface 104a of the layer of isolation material 104.

As will be appreciated in greater detail below, the cavity 112 is created with the help of a sacrificial portion which is formed under the body fin 106 during the initial steps of processing, and later removed through a highly selective etching process to form the cavity 112. The cavity limits source/drain leakage, which has been one of the major problems with bulk FinFETs and furthermore, this method of processing helps remove intra-fin STI oxide profile control issue as well as fin-height variation issues in bulk FinFETs. Moreover, the cavity provides comparable isolation performance when compared to SOI FinFETs, but with a lower processing cost.

Figure 2:
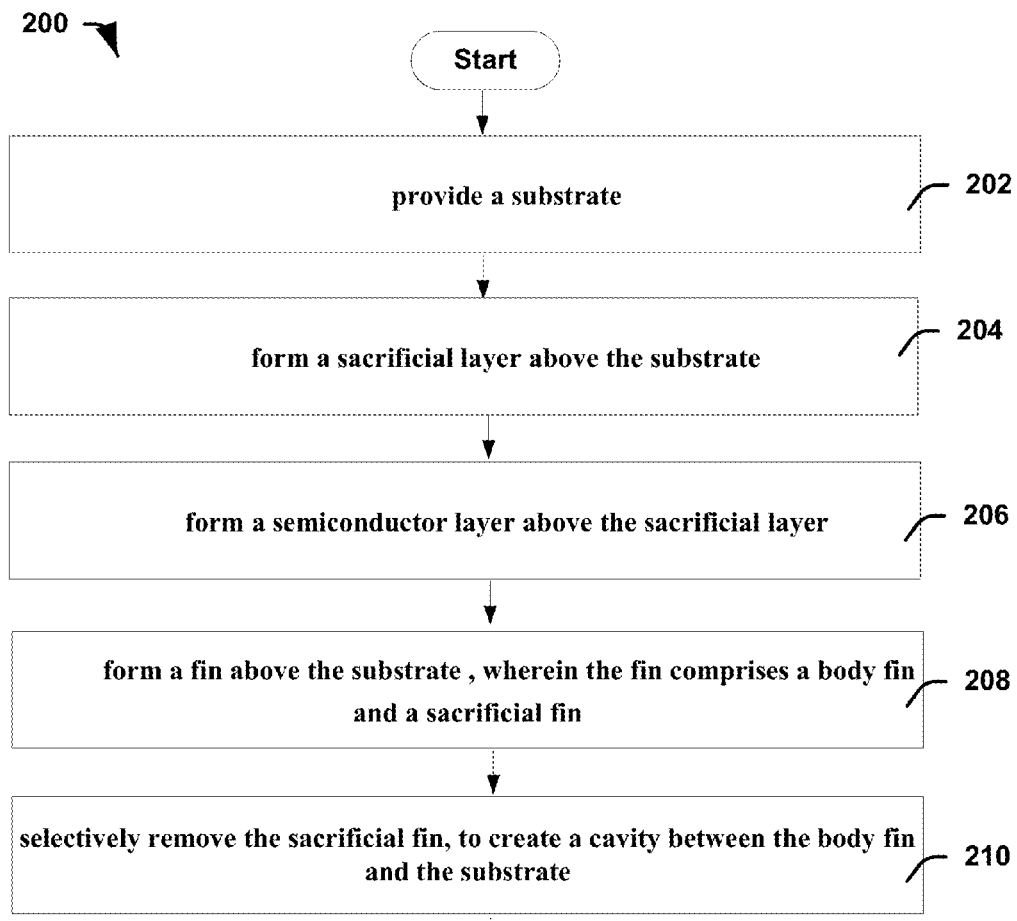
FIG. 2 illustrates a flow diagram of some embodiments of a method for forming a cavity between the fin and the semiconductor substrate under the fin, with the help of a sacrificial portion, according to the present disclosure.

FIG. 2 illustrates a flow diagram of some embodiments of a method 200 for forming a cavity between the fin and the semiconductor substrate under the fin, with the help of a sacrificial portion, according to the present disclosure. While disclosed method 200 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a substrate is provided. In some embodiments, the substrate comprises Si.

At 204, a sacrificial layer is formed over the substrate. In some embodiments, the sacrificial layer is grown through epitaxy and it comprises SiGe (silicon germanium).

At 206, a semiconductor fin layer, which later becomes the fin of the FinFET device is formed over the sacrificial layer. In some embodiments, the semiconductor fin layer is grown through epitaxy and it comprises Si.

At 208, a fin is formed above the substrate wherein the fin comprises a body fin and a sacrificial portion. The fin is formed by patterning and etching the sacrificial layer and the semiconductor fin layer creating fins separated by STI (shallow trench isolation) regions.

At 210, the sacrificial portion is selectively removed to create a cavity between the body fin and the substrate.

FIGS. 3-9 illustrate perspective views of embodiments of a step by step method for formation of a FinFET with an isolation region between the fin and the substrate under the fin, by forming and selectively removing a sacrificial portion, according to the present disclosure.

Figure 3:
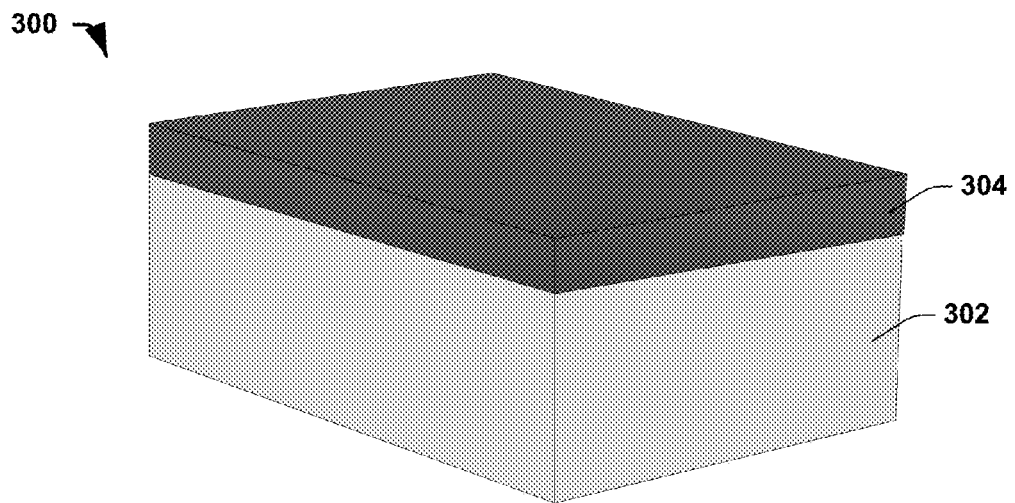
FIGS. 3-9 illustrate perspective views of embodiments of a step by step method for formation of a FinFET with a cavity between the fin and the substrate under the fin, by forming and selectively removing a sacrificial portion, according to the present disclosure.

FIG. 3 illustrates a perspective view of a semiconductor body 300 having a sacrificial layer 304 over a Si substrate 302. In some embodiments, the sacrificial layer 304 is grown epitaxially and comprises SiGe, while the Si substrate 302 can be a bulk Si substrate.

Figure 4:
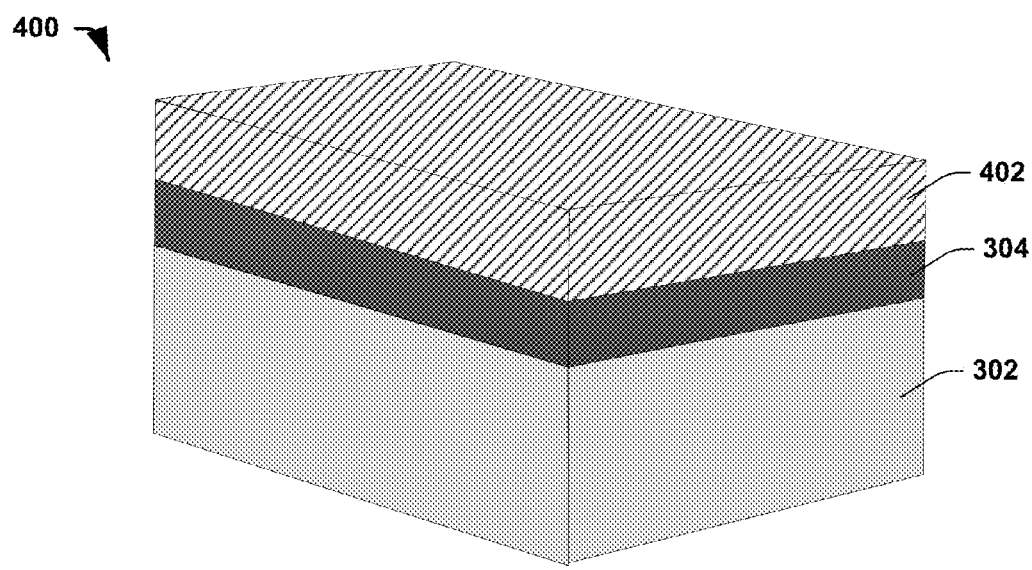

FIG. 4 illustrates a perspective view of a semiconductor body 400 where a semiconductor fin layer 402 is formed above the sacrificial layer 304. In some embodiments, the semiconductor fin layer 402 is grown epitaxially.

Figure 5:
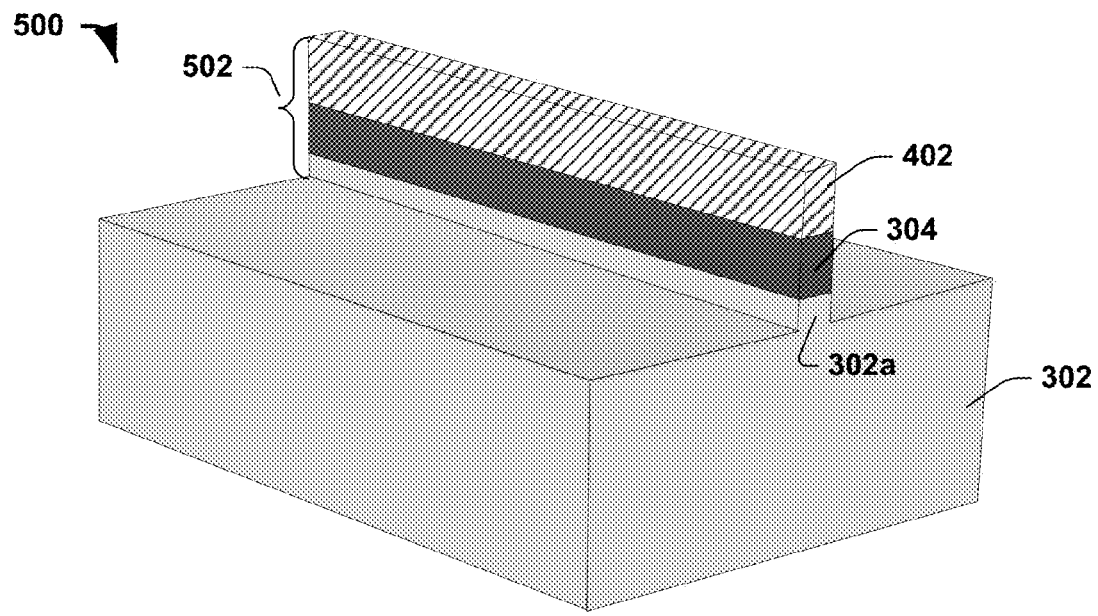

FIG. 5 illustrates a perspective view of a semiconductor body 500 after patterning and etching semiconductor fin layer 402 and sacrificial layer 304 to form a semiconductor fin 502. The semiconductor fin 502 includes; a body fin 402, a sacrificial portion 304 and a fin root portion 302a which is part of the Si substrate 302.

Figure 6:
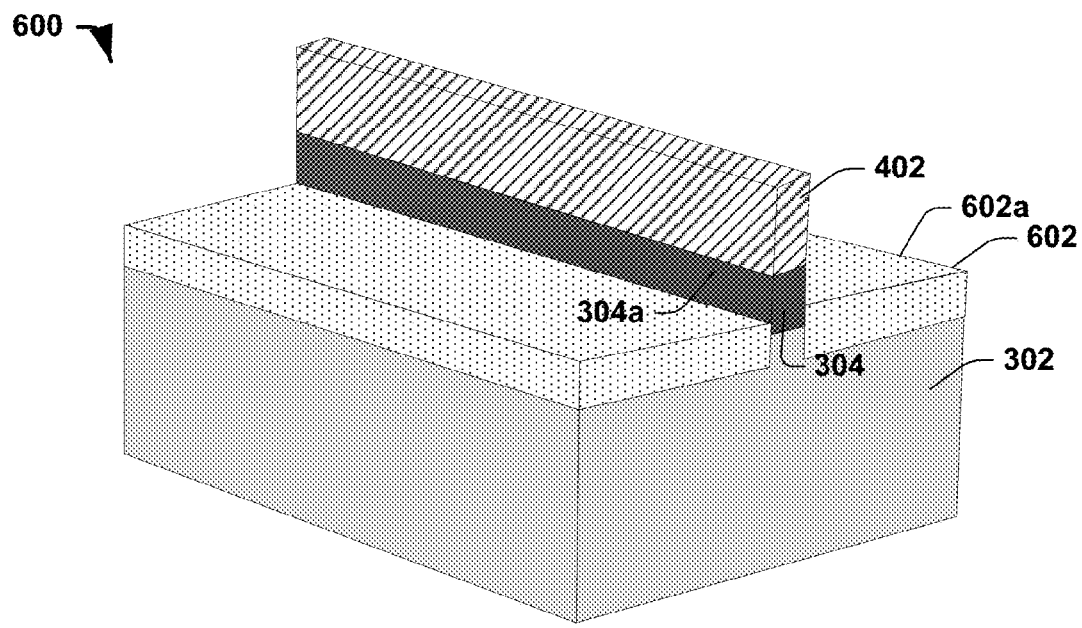

FIG. 6 illustrates a perspective view of a semiconductor body 600 after forming STI regions 602 on either side of the fin 502. In some embodiments, the STI oxide regions 602 are formed by depositing an insulating material over the entire substrate 302 and then etching them to desired height levels. In some embodiments, an upper STI surface 602a leaves an upper sidewall portion 304a of the sacrificial portion region exposed. In some embodiments, top surface of the fin root portion 302a is either higher of lower than the upper STI surface 602a.

Figure 7:
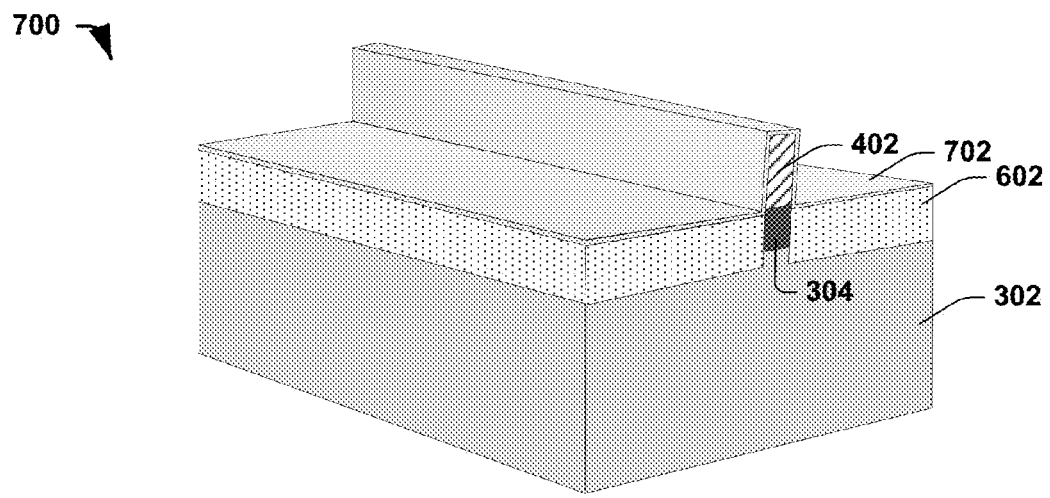

FIG. 7 illustrates a perspective view of a semiconductor body 700 after depositing a gate dielectric 702 over the entire surface of the semiconductor body 600. In some embodiments, the gate dielectric 702 comprises an oxide, but could also include a high-k dielectric in other embodiments.

Figure 8:
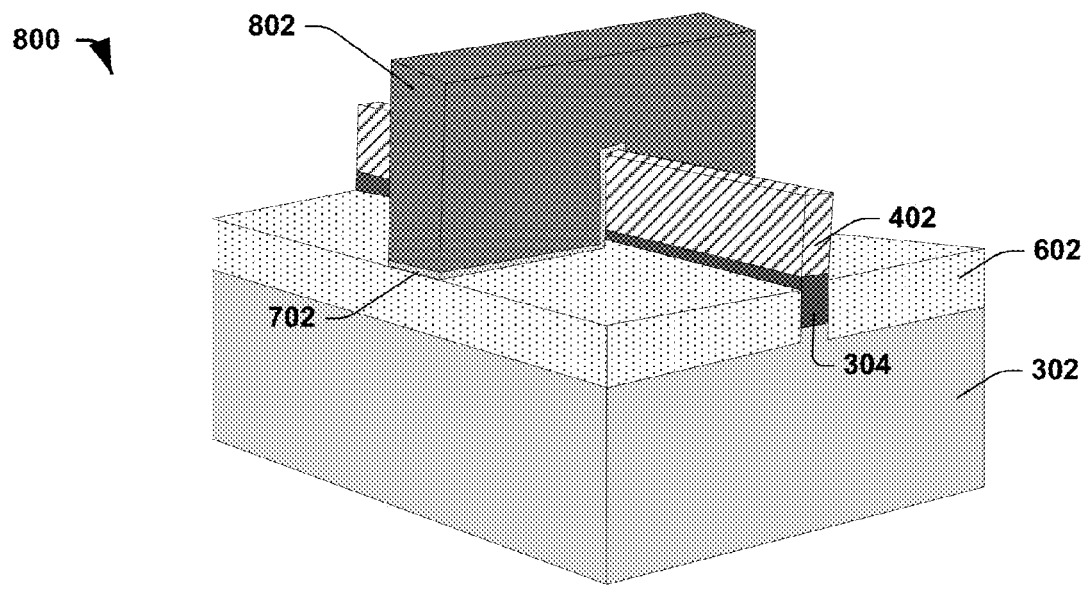

FIG. 8 illustrates a perspective view of a semiconductor body 800 after formation of a gate electrode 802. The gate dielectric 702 along with the gate electrode material 802 are patterned to form a gate structure that runs laterally across the fin 502 in a direction perpendicular to the orientation of the fin 502. The bottom surface of the gate dielectric 702 abuts the top surface of the body fin 402, upper side walls of the sacrificial portion 304, as well as the top surfaces of the STI regions 602 on either side of the fin 502. In some embodiments, the gate electrode material comprises polysilicon, but could also include metal in other embodiments.

Figure 9:
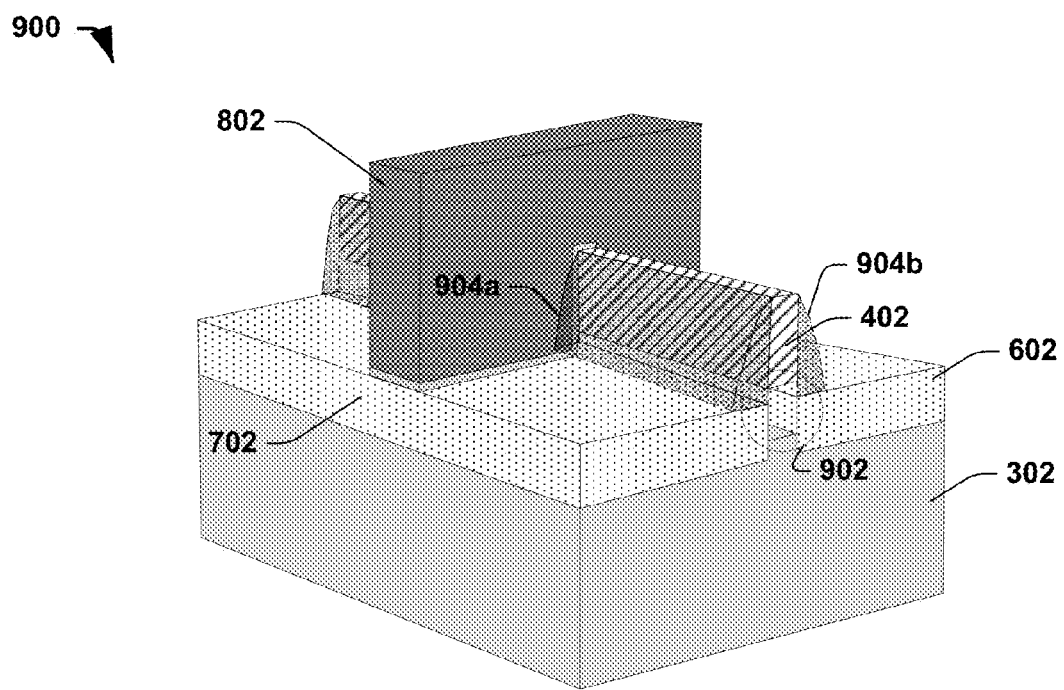

FIG. 9 illustrates a perspective view of a semiconductor body 900 after selectively removing the sacrificial portion 304. Removal of the sacrificial portion 304 creates a cavity 902 which isolates the body fin 402 from the bulk of the device or the semiconductor substrate 302. This makes sure there is no current leakage between the body fin 402 and the substrate 302. The suspended body fin 402 has an outer perimeter, as viewed from above that is substantially aligned to an outer perimeter of the cavity 902. In some embodiments, the sacrificial portion 304 is removed by a wet etch, a dry etch or a plasma etch (e.g. plasma dry etch with a mixture gas of CF4/O2/He, under 20 m Torr/800 W) In some embodiments, the sacrificial portion 304 may not be completely removed during the etching. A pair of sidewall spacers 904a and 904b are formed on outer sidewalls of the suspended body fin 402, wherein a sidewall spacer has a lower surface that abuts the upper surface of the layer of the STI region 602. In some embodiments, the sidewall spacers 904a and 904b comprises SiN (silicon nitride).

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a structure and method for forming FinFETs that exhibit fin isolation with a cavity in between the fin and the substrate aligned under the fin. The method involves isolating the fin of a FinFET device from the bulk of the substrate, by forming a sacrificial portion between the fin and the substrate (at an early processing stage), and later removing the sacrificial portion to create a cavity between the fin and the substrate. This method helps control current leakage and fin height variation, two major issues associated with bulk FinFETs. Fin isolation through sacrificial portion cavity provides comparable isolation performance of SOI FinFETs, yet with a low production cost associated with bulk FinFETs.

In some embodiments, the present disclosure relates to an integrated circuit (IC) including one or more FinFET devices formed on a semiconductor substrate, a FinFET device comprising, a gate electrode which overlies the semiconductor substrate and which has a gate dielectric on an underside of the gate electrode, and a fin of semiconductor material suspended from the gate dielectric, wherein a cavity separates a lower surface of the suspended fin from a region of the semiconductor substrate aligned under the fin.

In another embodiment, the present disclosure relates to an integrated circuit (IC) including one or more FinFET devices formed on a semiconductor substrate, a FinFET device comprising, a gate electrode which overlies the semiconductor substrate and wherein a gate dielectric is disposed on an underside of the gate electrode, and a fin of semiconductor material suspended from the gate dielectric, wherein the suspended fin comprises: a channel region arranged in the fin under the gate electrode and first and second source/drain regions arranged in the fin on opposite edges of the gate electrode, wherein a cavity separates a lower surface of the suspended fin from a region of the semiconductor substrate aligned under the fin.

In yet another embodiment, the present disclosure relates to a method of forming an integrated circuit comprising, providing a substrate, forming a sacrificial layer above the substrate, forming a semiconductor layer above the sacrificial layer, patterning the sacrificial layer and semiconductor layer to form a fin above the substrate, wherein the fin comprises a sacrificial portion region corresponding to the patterned sacrificial layer and a body fin region corresponding to the patterned semiconductor layer, and selectively removing the sacrificial portion region to create a cavity between the body fin region and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) including one or more FinFET devices formed on a semiconductor substrate, the IC comprising:

a gate electrode which overlies the semiconductor substrate and which has a gate dielectric on an underside of the gate electrode;

a fin of semiconductor material suspended from the gate dielectric, wherein a cavity separates a lower surface of the suspended fin from a region of the semiconductor substrate aligned under the fin; and a pair of sidewall spacers on opposing sidewalls of the suspended fin, wherein the pair of sidewall spacers have upper surfaces below an upper surface of the gate electrode and lower surfaces below the lower surface of the suspended fin.

2. The IC of claim 1, wherein the cavity limits current leakage between the fin and the region of the semiconductor substrate aligned under the fin.

3. The IC of claim 1, wherein the suspended fin comprises:

a channel region, arranged in the fin under the gate electrode and separated from the gate electrode by the gate dielectric; and first and second source/drain regions, arranged in the fin on opposite edges of the gate electrode.

4. The IC of claim 3, wherein the cavity extends continuously under the channel region and first and second source/drain regions to limit current leakage between the fin and the region of the semiconductor substrate aligned under the fin.

5. The IC of claim 1, wherein the suspended fin has an outer perimeter, as viewed from above, that is substantially aligned to an outer perimeter of the cavity.

6. The IC of claim 1, further comprising:

a layer of isolation material disposed over the semiconductor substrate and under both the gate electrode and gate dielectric, wherein the lower surface of the suspended fin is arranged above an adjacent upper surface of the layer of isolation material.

7. The IC of claim 6, wherein the cavity resides at least partially within the layer of isolation material between opposing inner sidewalls of the layer of isolation material and extends upwards to the lower surface of the suspended fin.

8. The IC of claim 6, further comprising:

wherein the pair of sidewall spacers have a lower surface that abuts the upper surface of the layer of isolation material such that the lower surface of the sidewall spacers is at a height that is less than that of the lower surface of the suspended fin.

9. An integrated circuit (IC) including one or more FinFET devices formed on a semiconductor substrate, a FinFET device comprising:

a gate electrode which overlies the semiconductor substrate and wherein a gate dielectric is disposed on an underside of the gate electrode;

a fin of semiconductor material suspended from the gate dielectric, wherein the suspended fin comprises: a channel region arranged in the fin under the gate electrode and first and second source/drain regions arranged in the fin on opposite edges of the gate electrode, wherein a cavity separates a lower surface of the suspended fin from a region of the semiconductor substrate aligned under the fin;

a layer of isolation material disposed over the semiconductor substrate and under both the gate electrode and gate dielectric;

wherein a lower surface of suspended fin is arranged above an adjacent upper surface of the layer of isolation material; and a pair of sidewall spacers on outer sidewalls of the suspended fin, wherein a sidewall spacer has a lower surface that abuts the upper surface of the layer of isolation material such that the lower surface of the sidewall spacer is at a height that is less than that of the lower surface of the suspended fin.

10. The IC of claim 9, wherein the suspended fin has an outer perimeter, as viewed from above, that is substantially aligned to an outer perimeter of the cavity.

11. The IC of claim 9, wherein the cavity extends continuously under the channel region and first and second source/drain regions to limit leakage between the fin and the region of the semiconductor substrate aligned under the fin.

12. The IC of claim 9, wherein the cavity resides at least partially within the layer of isolation material between opposing inner sidewalls of the layer of isolation material and extends upwards to the lower surface of the suspended fin.

13. A method of forming an integrated circuit comprising:

providing a substrate;

forming a sacrificial layer above the substrate;

forming a semiconductor layer above the sacrificial layer;

patterning the sacrificial layer and the semiconductor layer to form a fin above the substrate, wherein the fin comprises a sacrificial portion region corresponding to the patterned sacrificial layer and a body fin region corresponding to the patterned semiconductor layer;

forming isolation regions above the substrate on either side of the sacrificial portion region;

selectively removing the sacrificial portion region to create a cavity between the body fin region and the substrate; and forming a pair of sidewall spacers on outer sidewalls of the body fin region, wherein lower surfaces of the pair of sidewall spacers abut upper surfaces of the isolation regions, and are at a height that is less than that of a lower surface of the body fin region.

14. The method of claim 13, wherein, the isolation regions formed prior to selectively removing the sacrificial portion region, leave an upper sidewall portion of the sacrificial portion region exposed.

15. The method of claim 14, further comprising:

prior to selectively removing the sacrificial portion region, forming a gate dielectric layer over the body fin region and over the upper sidewall portion of the sacrificial portion region;

forming a conductive gate electrode layer over the gate dielectric layer; and patterning the conductive gate electrode layer and gate dielectric layer to form a conductive gate electrode which straddles the fin.

16. The method of claim 15, wherein the sacrificial portion is selectively removed after both the conductive gate electrode layer and gate dielectric layer have been patterned to form the conductive gate electrode.

17. The method of claim 13, wherein the sacrificial layer and the semiconductor layer are formed through epitaxial growth.

18. The method of claim 13 wherein selectively removing the sacrificial portion comprises a wet etch, a dry etch or plasma etch.

19. The IC of claim 1, wherein an upper surface of the region of the semiconductor substrate aligned under the fin vertically extends above upper surfaces of remaining regions of the semiconductor substrate.

20. The IC of claim 9, wherein an upper surface of the semiconductor substrate in the region of the semiconductor substrate aligned under the fin extends above an adjacent lower surface of the layer of isolation material.

* * * * *